(12) United States Patent
Im et al.

(10) Patent No.: US 12,553,120 B2
(45) Date of Patent: Feb. 17, 2026

(54) MASK

(71) Applicant: Samsung Display Co., Ltd., Yongin-si (KR)

(72) Inventors: Sungsoon Im, Suwon-si (KR); Minho Moon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 17/777,394

(22) PCT Filed: Jul. 23, 2020

(86) PCT No.: PCT/KR2020/009692
§ 371 (c)(1),
(2) Date: May 17, 2022

(87) PCT Pub. No.: WO2021/145523
PCT Pub. Date: Jul. 22, 2021

(65) Prior Publication Data
US 2023/0028524 A1    Jan. 26, 2023

(30) Foreign Application Priority Data

Jan. 15, 2020 (KR) .................. 10-2020-0005452

(51) Int. Cl.
*H01L 51/00* (2006.01)
*C23C 14/04* (2006.01)
(Continued)

(52) U.S. Cl.
CPC ............ *C23C 14/042* (2013.01); *C23C 14/24* (2013.01); *H10K 71/164* (2023.02); *H10K 71/166* (2023.02)

(58) Field of Classification Search
None
See application file for complete search history.

(56) References Cited

U.S. PATENT DOCUMENTS 6,890,385 B2 * 5/2005 Tsuchiya .............. C23C 14/042
118/721
6,930,021 B2 * 8/2005 Yotsuya ............... C23C 14/042
438/455
(Continued)

FOREIGN PATENT DOCUMENTS

CN    205688000 U    11/2016
CN    108588641 A    9/2018
(Continued)

OTHER PUBLICATIONS

International Search Report, with English translation, corresponding to International Application No. PCT/KR2020/009692 dated Oct. 29, 2020.

*Primary Examiner* — Jethro M. Pence
(74) *Attorney, Agent, or Firm* — Lerner David LLP

(57) ABSTRACT

A mask includes a mask frame including a first opening part; a first mask disposed on the mask frame and including a second opening part overlapping the first opening part in a plan view; a second mask including a mesh part having a mesh shape overlapping the second opening part in a plan view and disposed on the first mask; and a fixing part disposed on the second mask and extending along an edge of the second mask to surround the mesh part.

20 Claims, 14 Drawing Sheets

(51) Int. Cl.
*C23C 14/24* (2006.01)
*H01L 27/32* (2006.01)
*H01L 51/56* (2006.01)
*H10K 71/16* (2023.01)

(56) References Cited

U.S. PATENT DOCUMENTS

| | | | | |
|---|---|---|---|---|
| 7,821,199 | B2* | 10/2010 | Arai | H10K 71/166 |
| | | | | 313/506 |
| 8,273,179 | B2* | 9/2012 | Kim | B32B 3/266 |
| | | | | 118/721 |
| 9,284,638 | B2 | 3/2016 | Ko et al. | |
| 9,321,074 | B2 | 4/2016 | Ko et al. | |
| 9,394,600 | B2 | 7/2016 | Han | |
| 9,695,500 | B2* | 7/2017 | Ko | H10K 71/00 |
| 9,761,802 | B2 | 9/2017 | Kuriyama et al. | |
| 10,083,997 | B2* | 9/2018 | Kim | H10D 86/0221 |
| 10,186,662 | B2* | 1/2019 | Kim | H10K 71/00 |
| 10,224,350 | B2* | 3/2019 | Kim | B05C 21/005 |
| 10,439,170 | B2* | 10/2019 | Lin | H10K 71/00 |
| 10,533,245 | B2 | 1/2020 | Chang et al. | |
| 10,533,246 | B2* | 1/2020 | Mizumura | C25D 3/12 |
| 10,663,857 | B2* | 5/2020 | Lv | C23C 14/12 |
| 10,711,338 | B2* | 7/2020 | Kawato | C23C 14/042 |
| 10,787,729 | B2* | 9/2020 | Bai | C23C 14/24 |
| 10,982,314 | B2* | 4/2021 | Lin | C23C 14/042 |
| 11,566,322 | B2* | 1/2023 | Huang | C23C 16/042 |
| 11,678,559 | B2* | 6/2023 | Moon | H10K 71/00 |
| | | | | 438/22 |
| 11,800,780 | B2* | 10/2023 | Ji | C23C 14/24 |
| 11,937,492 | B2* | 3/2024 | Lee | G03F 7/0015 |
| 11,993,839 | B2* | 5/2024 | Zheng | C25D 3/54 |
| 12,077,841 | B2* | 9/2024 | Kim | C23C 14/08 |
| 2004/0202821 | A1* | 10/2004 | Kim | C23C 14/042 |
| | | | | 156/60 |
| 2016/0001542 | A1* | 1/2016 | Saito | B32B 15/00 |
| | | | | 156/247 |
| 2016/0168691 | A1* | 6/2016 | Takeda | H10K 59/35 |
| | | | | 118/504 |
| 2016/0301036 | A1* | 10/2016 | Han | H10K 71/166 |
| 2017/0036230 | A1* | 2/2017 | Mizumura | B05D 7/24 |
| 2017/0222145 | A1* | 8/2017 | Kim | H10K 71/00 |
| 2018/0023183 | A1* | 1/2018 | Kang | C23C 14/042 |
| | | | | 118/720 |
| 2018/0083192 | A1* | 3/2018 | Jeong | H10K 71/00 |
| 2018/0209029 | A1* | 7/2018 | Lin | B05C 21/005 |
| 2018/0239241 | A1* | 8/2018 | Lv | G03F 7/12 |
| 2019/0003033 | A1* | 1/2019 | Bai | B05C 21/005 |
| 2019/0203337 | A1* | 7/2019 | Luo | C23C 16/52 |
| 2020/0208284 | A1* | 7/2020 | Kim | C23C 14/34 |
| 2021/0013284 | A1* | 1/2021 | Moon | H10K 59/131 |
| 2021/0083189 | A1 | 3/2021 | Moon et al. | |
| 2021/0147976 | A1* | 5/2021 | Huang | G06F 1/189 |
| 2021/0249603 | A1* | 8/2021 | Kim | H10K 71/164 |
| 2021/0343760 | A1* | 11/2021 | Jo | C23C 14/042 |
| 2021/0404079 | A1* | 12/2021 | Xiao | C23C 14/042 |
| 2023/0079712 | A1* | 3/2023 | Li | H10K 71/166 |
| | | | | 118/720 |
| 2024/0384392 | A1* | 11/2024 | Kim | C23C 14/08 |

FOREIGN PATENT DOCUMENTS

| | | |
|---|---|---|
| CN | 110611054 | 12/2019 |
| JP | 2004-214015 | 7/2004 |
| JP | 2008-41327 | 2/2008 |
| JP | 2015-36451 | 2/2015 |
| KR | 100741138 B1 | 7/2007 |
| KR | 10-2010-0114685 | 10/2010 |
| KR | 10-2011-0032284 | 3/2011 |
| KR | 10-2017-0084738 | 7/2017 |
| KR | 10-2017-0130014 | 11/2017 |
| KR | 10-2018-0047594 | 5/2018 |
| KR | 10-2021-0032586 | 3/2021 |

* cited by examiner

MASK

CROSS REFERENCE TO RELATED APPLICATION(S)

This application is a national entry of International Application No. PCT/KR2020/009692, filed on Jul. 23, 2020, which claims under 35 U.S.C. §§ 119(a) and 365(b) priority to and benefits of Korean Patent Application No. 10-2020-0005452, filed on Jan. 15, 2020, in the Korean Intellectual Property Office (KIPO), the entire contents of which are incorporated herein by reference.

BACKGROUND

1. Technical Field

The disclosure relates to a mask.

2. Description of Related Art

In general, electronic devices such as smart phones, digital cameras, notebook computers, navigation systems, and smart televisions, which provide images to users, include display devices for displaying images. The display device generates an image and provides the generated image to a user through a display screen.

A display device includes a display panel that generates an image and functional elements that provide various functions to a user. The display panel is divided into a display area and a non-display area around the display area. The display panel includes pixels disposed in the display area to generate an image. The functional elements include a camera and a sensor disposed in a non-display area.

Recently, in order to extend the display area to the non-display area, technology development for arranging a camera in the display area is required. In case that the camera is disposed in the display area, pixels should not be disposed in the area in which the camera is disposed. For this, development of a mask for not forming pixels in an area where the camera is disposed is required.

SUMMARY

The disclosure provides a mask for more firmly fixing a mesh mask on which a blocking part overlapping a camera arrangement area is seated to a mask frame.

A mask according to an embodiment of the disclosure includes a mask frame including a first opening part, a first mask disposed on the mask frame and including a second opening part overlapping the first opening part in a plan view, a second mask including a mesh part having a mesh shape overlapping the second opening part in a plan view and disposed on the first mask, and a fixing part disposed on the second mask and extending along an edge of the second mask to surround the mesh part.

The fixing part may include fixing bars disposed along the edge of the second mask.

The fixing bars may include first fixing bars extending in a first direction and spaced apart from each other in a second direction intersecting the first direction, and second fixing bars extending in the second direction and spaced apart from each other in the first direction.

The fixing part may have a thickness in a range of about 600 micrometers to about 2000 micrometers.

The mesh part may include mesh lines defining the mesh shape, and each of the mesh lines may have a line width of 10 micrometers to 20 micrometers.

A gap between two mesh lines extending parallel to each other and facing each other may be in a range of about 0.5 millimeters to about 2 millimeters.

The mask may further include a blocking part disposed on a portion of the mesh part.

The blocking part may have a circular shape, and a diameter of the blocking part may be greater than the gap between the two mesh lines.

The blocking part may be connected to the mesh lines.

An edge of the first mask and the edge of the second mask may be adjacent to an edge of the mask frame.

The fixing part may be connected to the second mask, the first mask, and the mask frame.

The fixing part may include a first fixing part having an "L" shape; and a second fixing part facing the first fixing part and having a shape in which the "L" shape may be rotated by about 180 degrees.

The fixing part may have a rectangular frame shape.

A groove may be defined on an upper surface of the fixing part, and the groove may extend in an extending direction of the fixing part.

The groove may be defined in a predetermined portion of the upper surface of the fixing part.

The groove may be defined between the upper surface of the fixing part and one side of the fixing part.

The edge of the second mask may be adjacent to the second opening part and may be disposed outside the second opening part.

The fixing part may be connected to a portion of the second mask adjacent to the edge of the second mask, the portion of the second mask may be connected to a portion of the first mask adjacent the second opening part.

The fixing part may include an inner edge adjacent to the second opening part; a first inclined surface extending from the inner edge toward an upper surface of the fixing part disposed higher than the inner edge; and a second inclined surface extending from the inner edge toward the lower surface of the fixing part disposed lower than the inner edge, and the inner edge may be closer to the second opening part than the upper surface of the fixing part and the lower surface of the fixing part.

The first inclined surface and the second inclined surface may form an angle of about 30 degrees to about 60 degrees with respect to a direction perpendicular to the upper surface.

According to an embodiment of the disclosure, since the edge of the mesh mask on which the blocking part is seated is fixed by the fixing part, the mesh mask may be more firmly fixed to the open mask and the mask frame.

DETAILED DESCRIPTION OF THE EMBODIMENTS

Figure 1:
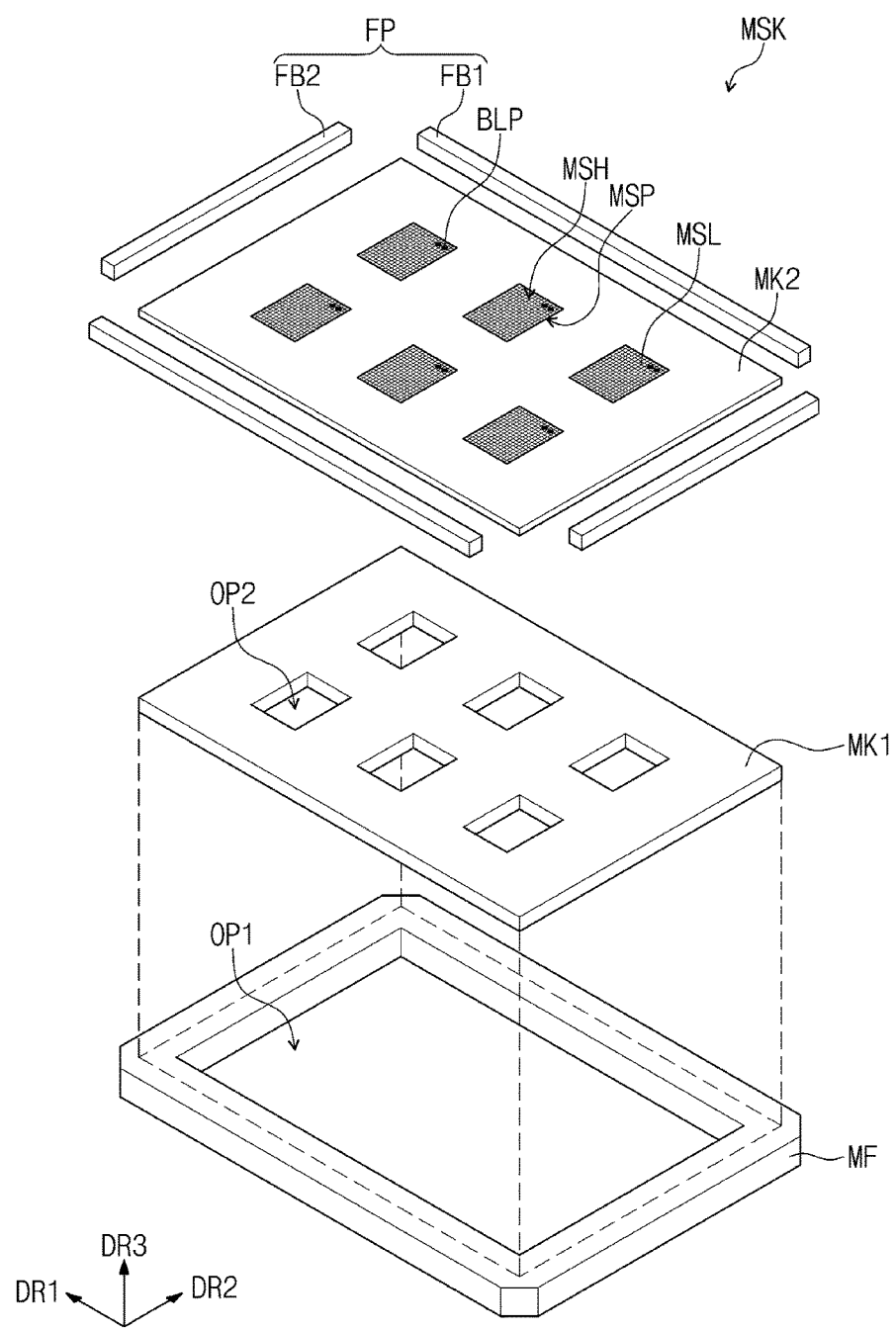
FIG. 1 is a schematic exploded perspective view of a mask according to an embodiment of the disclosure.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description.

The term "and/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the disclosure. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined or implied herein, all terms (including technical and scientific terms) used herein have the same meaning as commonly understood by one of ordinary skill in the art to which this disclosure belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the disclosure, the term "include," "comprise," "including," or "comprising," specifies a property, a region, a fixed number, a step, a process, an element and/or a component but does not exclude other properties, regions, fixed numbers, steps, processes, elements and/or components. It will be understood that the terms "contact," "connected to," and "coupled to" may include a physical and/or electrical contact, connection, or coupling.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the disclosure will be described in detail with reference to the drawings.

FIG. 1 is a schematic exploded perspective view of a mask according to an embodiment of the disclosure.

Referring to FIG. 1, a mask MSK according to an embodiment of the disclosure may include a mask frame MF, a first mask MK1, a second mask MK2, blocking parts BLP, and a fixing part FP.

The mask frame MF may have side surfaces extending in the first direction DR1 and side surfaces extending in the second direction DR2 intersecting the first direction DR1. Side surfaces of the mask frame MF may define edges of the mask frame MF. The mask frame MF may include a metal.

The mask frame MF may have a frame shape. According to the frame shape, a first opening part OP1 having a rectangular shape may be defined in the mask frame MF. The first opening part OP1 may have a rectangular shape extending longer in the first direction DR1 than in the second direction DR2.

Hereinafter, a direction intersecting a plane defined by the first and second directions DR1 and DR2 is defined as a third direction DR3. The third direction DR3 may substantially perpendicularly intersect a plane defined by the first and second directions DR1 and DR2. In the specification, in a plan view, it may refer to a state viewed in the third direction DR3.

The first mask MK1 may be disposed on the mask frame MF. The first mask MK1 may have a rectangular shape having long sides extending in the first direction DR1 and short sides extending in the second direction DR2. However, the shape of the first mask MK1 is not limited thereto. Long sides and short sides of the first mask MK1 are the side surfaces of the first mask MK1, and may be connected to each other to define an edge of the first mask MK1. The first mask MK1 may include a metal.

Second opening parts OP2 may be defined in the first mask MK1. When viewed on a plane or in a plan view, the second opening parts OP2 may overlap the first opening part OP1. The first mask MK1 in which the second opening parts OP2 are defined may be defined as an open mask. Each of the second opening parts OP2 may correspond to a display panel to be described later.

The second opening parts OP2 may be arranged in the first direction DR1 and the second direction DR2. In case that the first direction DR1 corresponds to a row direction and the second direction DR2 corresponds to a column direction, the second opening parts OP2 may be arranged in two rows and three columns.

For example, six second opening parts OP2 arranged in two rows and three columns are illustrated, but the number of second opening parts OP2 is not limited thereto. For example, at least one second opening part OP2 may be defined in the first mask MK1.

The second opening parts OP2 may have a rectangular shape extending longer in the second direction DR2 than in the first direction DR1. However, the disclosure is not limited thereto, and the second opening parts OP2 may have various shapes such as a circle and a polygon.

The second mask MK2 may be disposed on the first mask MK1. The second mask MK2 may have a rectangular shape having long sides extending in the first direction DR1 and short sides extending in the second direction DR2. However, the shape of the second mask MK2 is not limited thereto. Long sides and short sides of the second mask MK2 are side surfaces of the second mask MK2, and may be connected to each other to define an edge of the second mask MK2. The second mask MK2 may include a metal.

The second mask MK2 may include mesh parts MSP having a mesh shape. The second mask MK2 may be defined as a mesh mask. In a plan view, the mesh parts MSP may overlap the second opening parts OP2, respectively. Accordingly, the mesh parts MSP may be arranged in the first direction DR1 and the second direction DR2.

For example, six mesh parts MSP arranged in two rows and three columns are shown, but the number of mesh parts MSP is not limited thereto. For example, the second mask MK2 may include at least one mesh part MSP overlapping at least one second opening part OP2.

The mesh parts MSP may have a shape corresponding to the second opening parts OP2. The mesh parts MSP, similar to the second opening parts OP2, may have a rectangular shape extending longer in the second direction DR2 than in the first direction DR1. However, the disclosure is not limited thereto, and the mesh parts MSP may have various shapes such as a circle or a polygon, depending on the shape of the second opening parts OP2.

Each of the mesh parts MSP may include mesh lines MSL for defining a mesh shape. The mesh lines MSL may extend in the first direction DR1 and the second direction DR2. The mesh lines MSL extending in the first direction DR1 may be arranged in the second direction DR2, and the mesh lines MSL extending in the second direction DR2 may be arranged in the first direction DR1.

A mesh shape may be defined by mesh lines MSL intersecting each other. Spaces between mesh lines MSL that are adjacent to each other and intersect each other may be defined as mesh holes MSH. The mesh holes MSH may have a rectangular shape.

The fixing part FP may be disposed on the second mask MK2. The fixing part FP may include fixing bars FB1 and FB2 having a rod shape. The fixing bars FB1 and FB2 may be adjacent to the edge of the second mask MK2. The fixing bars FB1 and FB2 may include a metal. For example, the fixing bars FB1 and FB2 may include Invar or stainless steel.

The fixing bars FB1 and FB2 may include first fixing bars FB1 extending in the first direction DR1 and spaced apart from each other in the second direction DR2 and second fixing bars FB2 extending in the second direction DR2 and spaced apart from each other in the first direction DR1.

The blocking parts BLP may be disposed on the mesh parts MSP. A predetermined number of blocking parts BLP may be disposed on a corresponding mesh part MSP among mesh parts MSP. For example, two blocking parts BLP may be disposed on a corresponding mesh part MSP among mesh parts MSP. However, the number of blocking parts BLP disposed on the mesh parts MSP is not limited thereto. For example, at least one blocking part BLP may be disposed on a corresponding mesh part MSP. The blocking parts BLP may include a metal.

Figure 2:
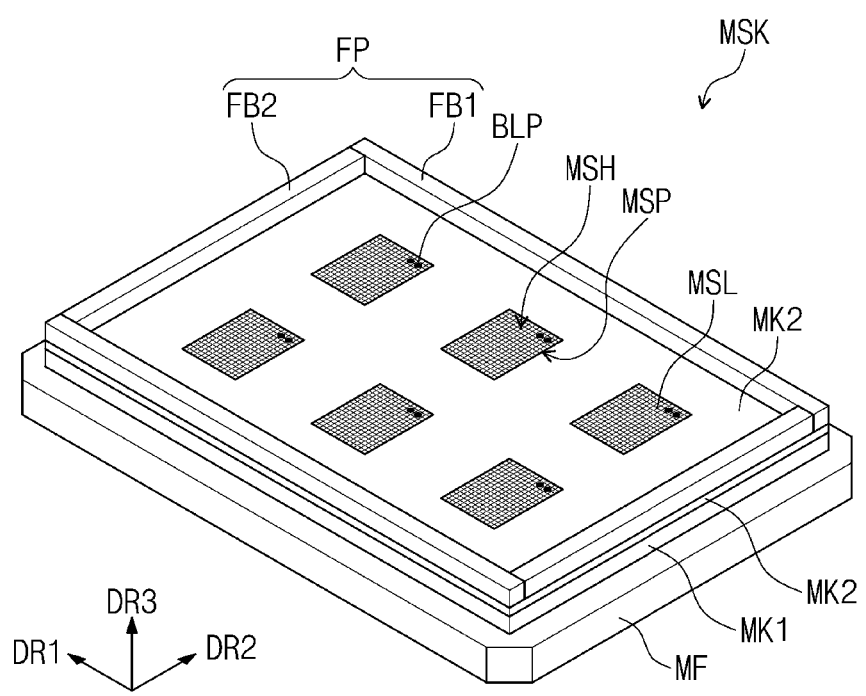
FIG. 2 is a schematic perspective view of a mask combining the components of the mask shown in FIG. 1.
Figure 3:
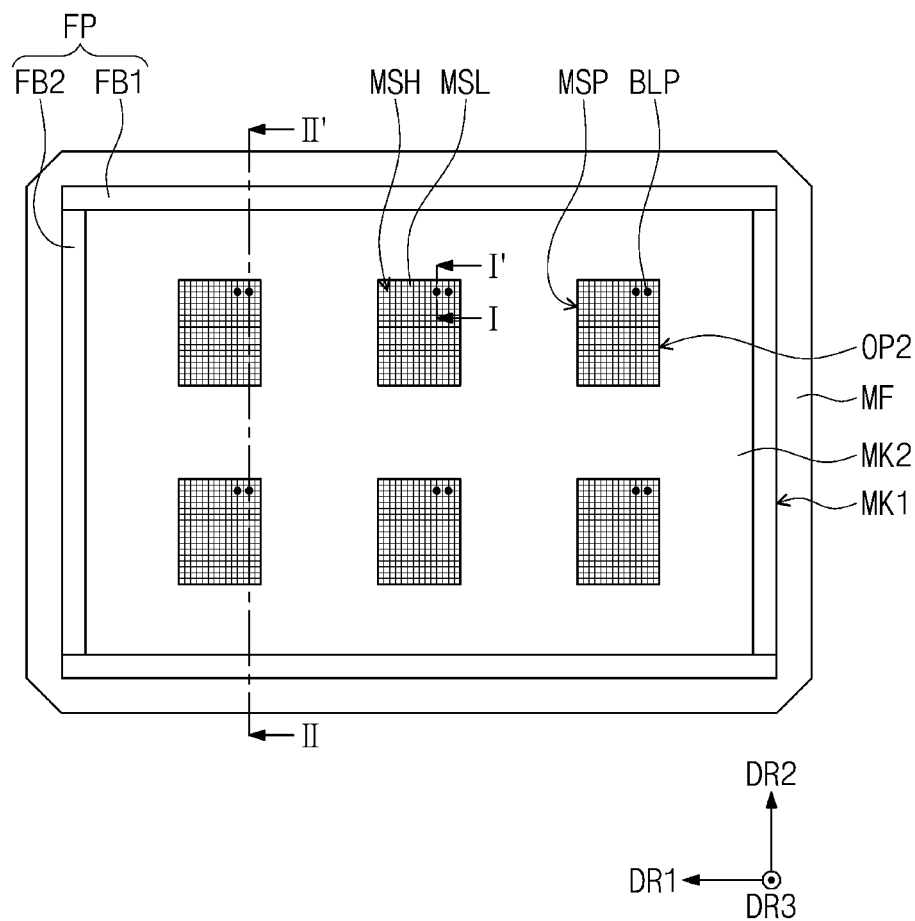
FIG. 3 is a schematic plan view of the mask shown in FIG. 2 as viewed from above.

FIG. 2 is a schematic perspective view of a mask with the components of the mask shown in FIG. 1 combined. FIG. 3 is a schematic plan view of the mask shown in FIG. 2 as viewed from above.

Referring to FIGS. 2 and 3, in a plan view, the edge of the first mask MK1 and the edge of the second mask MK2 may be disposed adjacent to the edge of the mask frame MF. The edge of the first mask MK1 and the edge of the second mask MK2 may not overlap the edge of the mask frame MF. However, this is illustrated by way of example, and the edge of the first mask MK1 and the edge of the second mask MK2 may overlap the edge of the mask frame MF.

In a plan view, the edge of the second mask MK2 may overlap the edge of the first mask MK1. However, this is illustrated by way of example, and the edge of the second mask MK2 may not overlap the edge of the first mask MK1 and may be adjacent to the edge of the first mask MK1.

In a plan view, the fixing part FP may extend along the edge of the second mask MK2 to surround the mesh parts MSP. For example, in a plan view, the first and second fixing bars FB1 and FB2 may be disposed along the edge of the second mask MK2 to surround the mesh parts MSP. The second opening parts OP2 overlapping the mesh parts MSP may also be surrounded by the first and second fixing bars FB1 and FB2 in a plan view.

The outer surfaces of the fixing part FP may overlap the edge of the second mask MK2. For example, side surfaces of the first and second fixing bars FB1 and FB2 facing outward may overlap the edge of the second mask MK2.

The fixing part FP may be extended and fixed to the second mask MK2, the first mask MK1, and the mask frame MF by laser welding. For example, a laser is irradiated from above the fixing part FP toward the fixing part FP, and the fixing part FP, the second mask MK2, the first mask MK1, and the mask frame MF may be melted and connected to each other by heat according to the energy of the laser. Accordingly, the fixing part FP, the second mask MK2, the first mask MK1, and the mask frame MF may be connected to each other and fixed.

In an embodiment of the disclosure, the second mask MK2 is not fixed only to the first mask MK1. The second mask MK2 may be fixed to the first mask MK1, and the fixing part FP may be provided on the second mask MK2 to additionally fix the second mask MK2. The fixing part FP may more firmly fix the second mask MK2 to the first mask MK1 and the mask frame MF.

In case that the second mask MK2 having a thin sheet shape is fixed to the first mask MK1, the fixed state of the second mask MK2 may not be stable. In an embodiment of the disclosure, since the fixing part FP is provided on the second mask MK2 to additionally fix the second mask MK2, the second mask MK2 may be more firmly fixed.

The first and second fixing bars FB1 and FB2 may be disposed adjacent to each other to surround the mesh parts MSP to form a rectangular frame shape. Ends of the first and second fixing bars FB1 and FB2 may contact each other to form a rectangular frame shape.

Each of the two blocking parts BLP among the blocking parts BLP may be disposed on portions of a corresponding mesh part MSP among the mesh parts MSP. For example, in a plan view, the two blocking parts BLP may be disposed adjacent to vertices on the upper and right sides of the corresponding mesh part MSP. However, the arrangement positions of the two blocking parts BLP are not limited thereto.

For example, the blocking parts BLP may have a circular shape. However, the disclosure is not limited thereto, and the blocking parts BLP may have various shapes such as an ellipse or a polygon. The blocking parts BLP may be connected to the mesh parts MSP by welding and fixed to the mesh parts MSP. For example, the blocking parts BLP may be connected to the mesh lines MSL by laser welding and fixed to the mesh lines MSL.

Figure 4:
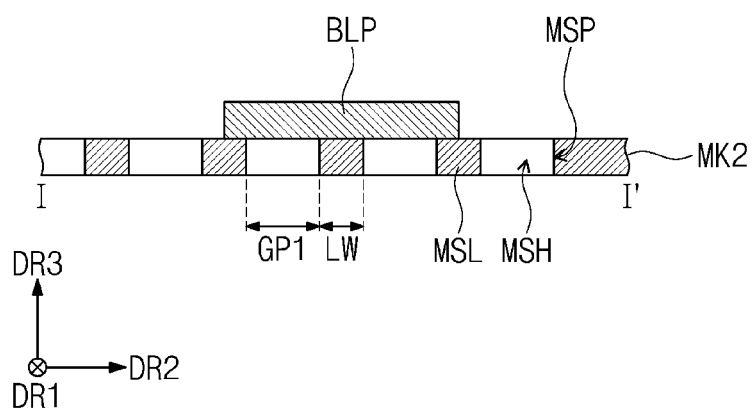
FIG. 4 is a schematic cross-sectional view taken along line I-I' shown in FIG. 3.

FIG. 4 is a schematic cross-sectional view taken along line I-I' shown in FIG. 3.

Referring to FIG. 4, the line width LW of each of the mesh lines MSL may be about 10 µm to about 20 µm. The line width LW may be defined as a width of each of the mesh lines MSL measured in a direction intersecting the extending direction of each of the mesh lines MSL. The first gap GP1 between the two mesh lines MSL extending parallel to each other and facing each other may be about 0.5 mm to about 2 mm.

The blocking part BLP may be disposed on the mesh lines MSL and connected to the mesh lines MSL. The diameter of the blocking part BLP may be larger (or greater) than the first gap GP1. In case that the diameter of the blocking part BLP is smaller than the first gap GP1, the blocking part BLP may fall down through the mesh hole MSH. Since the diameter of the blocking part BLP is larger than the first gap GP1, the blocking part BLP may be stably seated on the mesh lines MSL. The mesh part MSP may be a structure used to substantially arrange the blocking part BLP.

Figure 5:
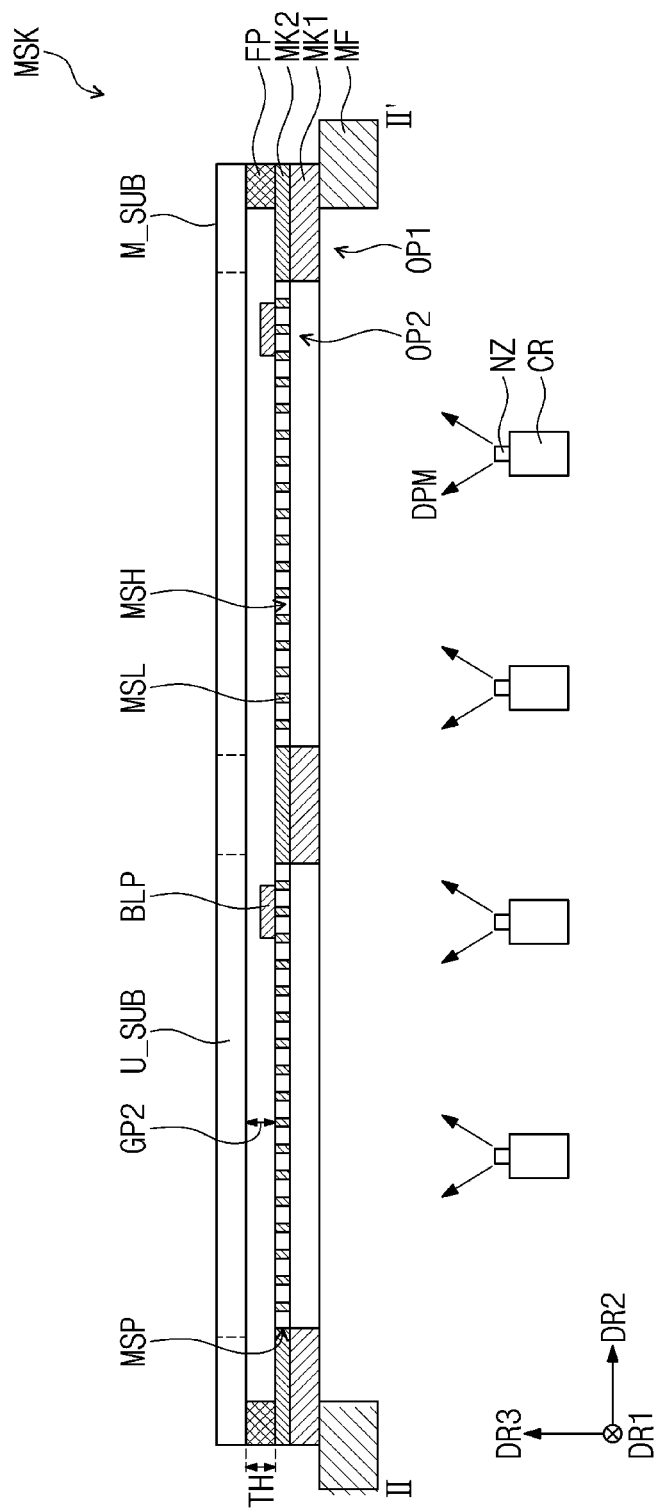
FIG. 5 is a schematic cross-sectional view taken along line II-II' shown in FIG. 3.

FIG. 5 is a schematic cross-sectional view taken along line II-II' shown in FIG. 3.

FIG. 5 illustrates as an example a mother substrate M_SUB used in manufacturing a display panel to explain a manufacturing step of the display panel.

Referring to FIG. 5, the mother substrate M_SUB may be disposed on the fixing part FP. The mother substrate M_SUB may include unit substrates U_SUB. Each of the unit substrates U_SUB may be used to manufacture a display panel. A display panel may be manufactured by forming pixels on each of the unit substrates U_SUB and cutting the unit substrates U_SUB.

The fixing part FP may support the edge of the mother substrate M_SUB. By the fixing part FP, the mother substrate M_SUB may be spaced upward from the second mask MK2 by a second gap GP2. The fixing part FP may have a thickness of about 600 µm to about 2000 µm in the third direction DR3. For example, according to the thickness of the fixing part FP, the second gap GP2 may be set to about 600 µm to about 2000 µm.

Upper and lower surfaces of the fixing part FP opposite to each other in the third direction DR3 may have planes defined by the first and second directions DR1 and DR2. The third direction DR3 may be defined as a direction perpendicular to each of the upper and lower surfaces of the fixing part FP.

In a plan view, the unit substrates U_SUB may overlap the mesh parts MSP, respectively. Also, in a plan view, the unit substrates U_SUB may overlap the second opening parts OP2, respectively. In a plan view, the unit substrates U_SUB, the mesh parts MSP, and the second opening parts OP2 are disposed within the first opening part OP1 to overlap the first opening part OP1.

Crucibles CR may be disposed under the mask MSK. A nozzle NZ may be disposed on each of the crucibles CR. A deposition material DPM may be accommodated in the crucibles CR. Although not shown in the drawing, a heat source for heating the crucibles CR may be disposed in the crucibles CR. In addition, the crucibles CR, the mask MSK, and the mother substrate M_SUB may be disposed in a vacuum chamber used in a manufacturing process of the display panel.

The crucibles CR may be heated, and the deposition material DPM may be vaporized and sprayed upward through the nozzle NZ. The vaporized deposition material DPM may pass through the first opening part OP1, the second opening parts OP2, and the mesh parts MSP to be deposited on a lower surface of the unit substrates U_SUB.

In a peripheral area of each of the second opening parts OP2, the deposition material DPM may not be provided to the mother substrate M_SUB because it is blocked by the first mask MK1. Accordingly, the deposition material DPM may not be provided on a portion of the mother substrate M_SUB between the unit substrates U_SUB.

Figure 6:
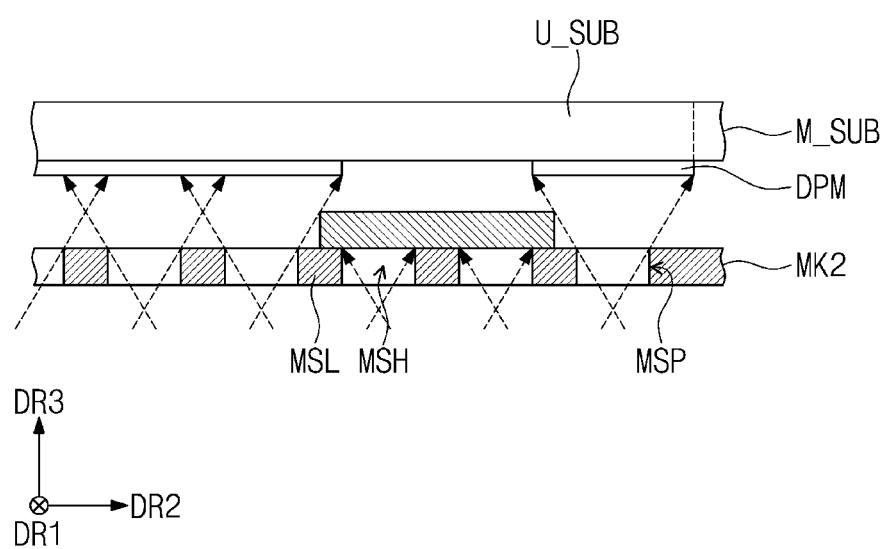
FIG. 6 is a schematic enlarged view illustrating a part overlapping the blocking part and a part adjacent to the blocking part in the mask shown in FIG. 5.

FIG. 6 is a schematic enlarged view illustrating a part overlapping the blocking part and a part adjacent to the blocking part in the mask shown in FIG. 5.

For example, FIG. 6 illustrates a cross-section corresponding to FIG. 4, and the injection direction of the deposition material DPM is illustrated by a dotted arrow in FIG. 6.

Referring to FIG. 6, the deposition material DPM may be provided on the unit substrate U_SUB through the mesh holes MSH. The deposition material DPM may have a spray angle and may advance upward. As described above, the mesh part MSP may be spaced apart from the unit substrate U_SUB by the second gap GP2.

In this case, even if a portion of the deposition material DPM is blocked by the mesh lines MSL, the deposition material DPM that has a spray angle and advances upward may pass through the mesh holes MSH and be normally deposited on the unit substrate U_SUB.

In case that the mesh part MSP and the unit substrate U_SUB contact each other, the deposition material DPM may not be deposited on the portion of the unit substrate U_SUB overlapping the mesh lines MSL. For example, the mesh lines MSL may serve as a mask.

Since the deposition material DPM has a spray angle and advances upward, as the mesh part MSP and the unit substrate U_SUB move away from each other, the portion of the unit substrate U_SUB on which the deposition material DPM is not deposited may decrease. In case that the mesh part MSP and the unit substrate U_SUB are spaced apart from each other by a specific gap or more, the deposition material DPM may be deposited over the entire unit substrate U_SUB.

In case that the line width LW of each of the mesh lines MSL is about 10 µm to about 20 µm, the first gap GP1 between the mesh lines MSL is about 0.5 mm to about 2 mm, and the second gap GP2 between the mesh part MSP and the unit substrate U_SUB is greater than or equal to about 600 µm, the deposition material DPM may be deposited on the entire unit substrate U_SUB.

Even if the deposition material DPM advances upward with a spray angle, the deposition material DPM may be blocked by the blocking part BLP depending on the size of the blocking part BLP. For example, the blocking part BLP may serve as a mask to block the progress of the deposition material DPM. Accordingly, the deposition material DPM may not be provided on the portion of the unit substrate U_SUB overlapping the blocking part BLP.

A portion of the unit substrate U_SUB on which the deposition material DPM is not deposited by the blocking part BLP may be defined as an area for placing the camera. A portion of the unit substrate U_SUB overlapping the blocking part BLP will be defined as a first area of the display panel and will be described below.

Figure 7:
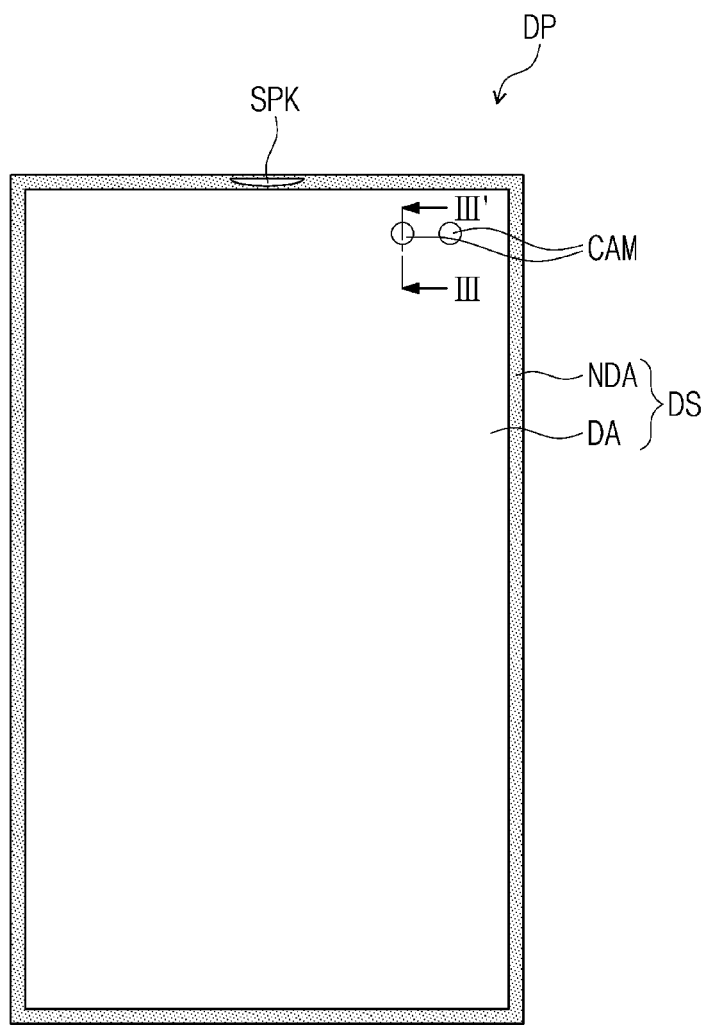
FIG. 7 is a plan view of a display panel manufactured using the mask shown in FIG. 1.

FIG. 7 is a schematic plan view of a display panel manufactured by using the mask illustrated in FIG. 1.

Referring to FIG. 7, the flat area of a display panel DP may include a display area DA and a non-display area NDA that surrounds the display area DA and defines a border of the display panel DP. The display panel DP may include pixels disposed in the display area DA. The structure of the pixels will be described in detail below with reference to FIG. 8.

The display panel DP according to an embodiment of the disclosure may be a light emitting display panel, but the disclosure is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the display panel DP is described as the organic light emitting display panel.

The display panel DP may have a rectangular shape having long sides extending in the second direction DR2 and short sides extending in the first direction DR1. However, the disclosure is not limited thereto, and the display panel DP may have various shapes such as a circular shape or a polygonal shape.

Functional elements may be disposed on the display panel DP. The functional elements may include a speaker SPK and cameras CAM. The speaker SPK may be disposed in the non-display area NDA, and the cameras CAM may be disposed in the display area DA. The cameras CAM may be disposed under the display panel DP.

Figure 8:
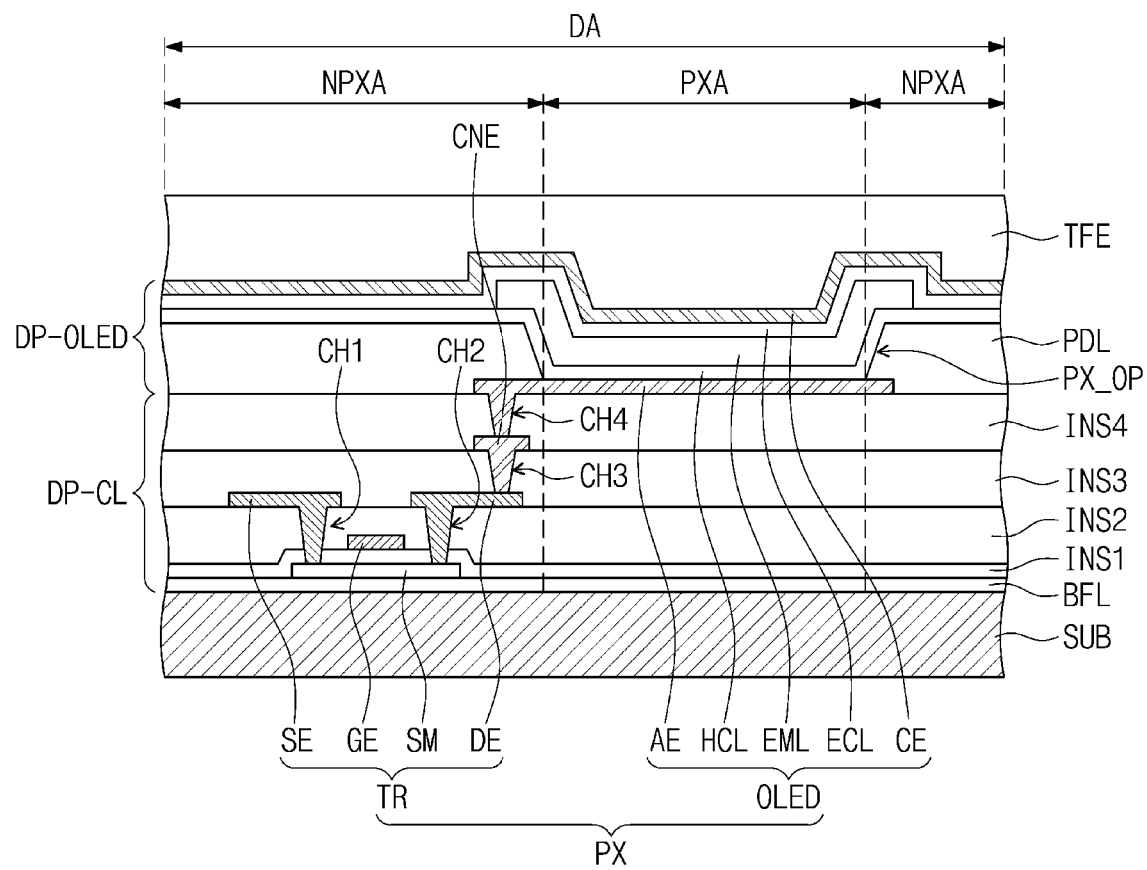
FIG. 8 is a diagram illustrating as an example a schematic cross-sectional configuration of pixels disposed in the display area shown in FIG. 7.

FIG. 8 is a schematic diagram illustrating as an example a cross-sectional configuration of pixels disposed in the display area shown in FIG. 7.

For example, one pixel PX is illustrated, but multiple pixels PX illustrated in FIG. 8 may be provided in the display area DA.

Referring to FIG. 8, the display area DA may include an emission area PXA and a non-emission area NPXA around the emission area PXA. Practically, emission areas PXA may be provided in the display area DA.

The pixel PX may include a light emitting element OLED and a transistor TR connected to the light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on a substrate SUB. The light emitting element OLED may be disposed in the emission area PXA, and the transistor TR may be disposed in the non-emission area NPXA. A buffer layer BFL is disposed on the substrate SUB, and the buffer layer BFL may include an inorganic material.

A semiconductor layer SM of the transistor TR may be disposed on the buffer layer BFL. The semiconductor layer SM may include a semiconductor made of an inorganic material such as amorphous silicon or polycrystalline silicon, or an organic semiconductor. Also, the semiconductor layer SM may include an oxide semiconductor. Although not shown in FIG. 8, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR overlapping the semiconductor layer SM may be disposed on the first insulating layer INS1. The gate electrode GE may be disposed to overlap a channel region of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source region of the semiconductor layer SM through a first contact hole CH1 defined in the first insulating layer INS1 and the second insulating layer INS2. The drain electrode DE may be connected to the drain region of the semiconductor layer SM through a second contact hole CH2 defined in the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may include an organic material. A connection electrode CNE may be disposed on the third insulating layer INS3. The connection electrode CNE may be connected to the drain electrode DE through a third contact hole CH3 defined in the third insulating layer INS3.

A fourth insulating layer INS4 may be disposed on the third insulating layer INS3 to cover the connection electrode CNE. The first electrode AE may be disposed on the fourth insulating layer INS4. The first electrode AE may be connected to the connection electrode CNE through a fourth contact hole CH4 defined in the fourth insulating layer INS4.

A pixel defining layer PDL exposing a portion of the first electrode AE may be disposed on the first electrode AE and the fourth insulating layer INS4. An opening part PX_OP for exposing a portion of the first electrode AE may be defined in the pixel defining layer PDL.

The hole control layer HCL may be disposed on the first electrode AE and the pixel defining film PDL. The hole control layer HCL may be commonly disposed in the emission area PXA and the non-emission area NPXA. The hole control layer HCL may include a hole transport layer, and may further include a hole injection layer.

The light emitting layer EML may be disposed on the hole control layer HCL. The light emitting layer EML may be disposed in an area corresponding to the opening part PX_OP. For example, the light emitting layer EML may be formed in the pixels PX to be separated from each other. The light emitting layer EML may include an organic material and/or an inorganic material. The light emitting layer EML may generate any of red, green, and blue light. However, the disclosure is not limited thereto, and the light emitting layer EML may generate white light by combining red, green, and blue organic materials.

The electron control layer ECL may be disposed on the light emitting layer EML. The electron control layer ECL may be disposed on the hole control layer HCL to cover the light emitting layer EML. For example, the electron control layer ECL may be commonly disposed in the emission area PXA and the non-emission area NPXA. The electron control layer ECL may include an electron transport layer and may further include an electron injection layer.

The second electrode CE may be disposed on the electron control layer ECL. The second electrode CE may be commonly disposed on the pixels PX. A thin film sealing layer TFE may be disposed on the second electrode CE.

A layer from the buffer layer BFL to the fourth insulating layer INS4 may be defined as a circuit element layer DP-CL. A layer from the first electrode AE to the second electrode CE may be defined as a display element layer DP-OLED.

A first voltage may be applied to the first electrode AE, and a second voltage having a lower level than the first voltage may be applied to the second electrode CE. The holes and electrons injected into the light emitting layer EML are combined to form excitons, and as the excitons transition to the ground state, the light emitting element OLED may emit light. The light emitting element OLED may emit light to display an image.

Figure 9:
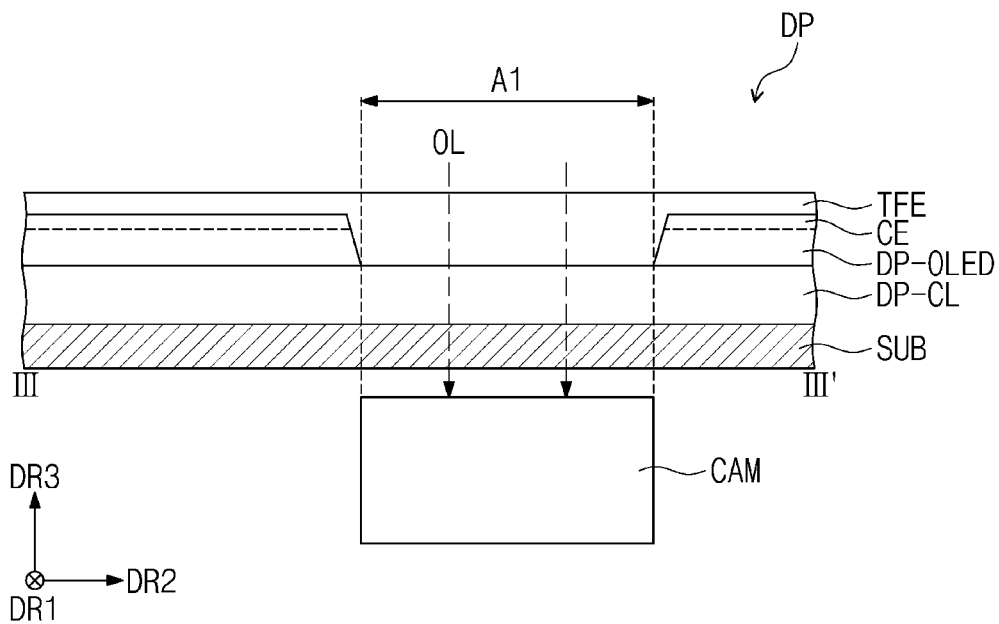
FIG. 9 is a schematic cross-sectional view taken along line III-III' shown in FIG. 7.

FIG. 9 is a schematic cross-sectional view taken along line III-III' shown in FIG. 7.

In accordance with the necessity of the following description, FIG. 6 will be described together.

Referring to FIGS. 6 and 9, the display panel DP may include a first area A1. The first area A1 may overlap the blocking part BLP. A camera CAM may be disposed under the first area A1. If a light emitting element OLED displaying an image is disposed in the first area A1, it may be difficult for the camera CAM to capture an external image. Accordingly, the light emitting element OLED may not be disposed in the first area A1. For example, the display element layer DP-OLED may not be formed in the first area A1.

In order not to provide the deposition material DPM in the first area A1, the second mask MK2 may be used. For example, in case that the second electrode CE, the hole control layer HCL, and the electron control layer ECL disposed in both the emission area PXA and the non-emission area NPXA are formed, the second mask MK2 may be used.

In case that deposition materials for forming the second electrode CE, the hole control layer HCL, and the electron control layer ECL are deposited on the substrate SUB, the deposition materials may not be provided in the first area A1 because they are blocked by the blocking part BLP. Accordingly, the light emitting element OLED may not be formed in the first area A1. The camera CAM may capture an external image by using external light OL provided through the first area A1.

Although not shown in the drawing, the first electrode AE and the light emitting layer EML may not be formed in the first area A1. However, in order not to form the first electrode AE and the light emitting layer EML in the first area A1, a mask different from the second mask MK2 may be used.

Figure 10:
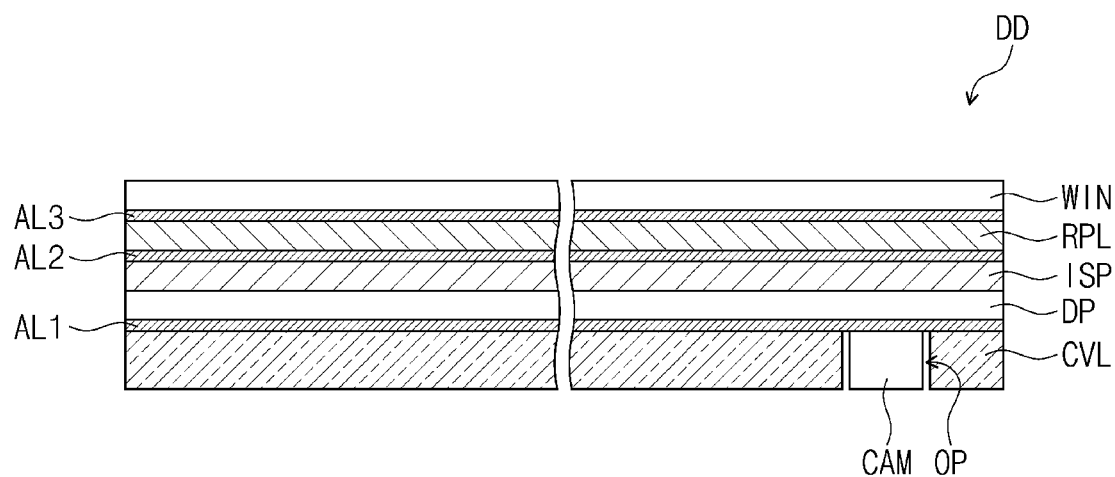
FIG. 10 is a schematic diagram illustrating as an example a schematic cross-section of a display device manufactured using the display panel shown in FIG. 7.

FIG. 10 is a schematic diagram illustrating as an example a cross-section of a display device manufactured using the display panel shown in FIG. 7.

Referring to FIG. 10, a display device DD may include a display panel DP, an input detection part ISP, an antireflection layer RPL, a window WIN, a cover layer CVL, and first to third adhesive layers AL1 to AL3. The display panel DP, the input detection part ISP, the antireflection layer RPL, and the window WIN are disposed on the display panel DP, and the cover layer CVL may be disposed under the display panel DP.

The input detection part ISP may be disposed on the display panel DP. The input detection part ISP may include sensor parts (not shown) for detecting an external input. The sensor parts may sense an external input in a capacitive manner. The input detection part ISP may be directly manufactured on the display panel DP in case that the display panel DP is manufactured. However, the disclosure is not limited thereto, and the input detection part ISP may be manufactured as a panel separated from the display panel DP and then, attached to the display panel DP by an adhesive layer.

The antireflection layer RPL may be disposed on the input detection part ISP. The antireflection layer RPL may be defined as an external light antireflection film. The antireflection layer RPL may reduce reflectance of external light incident on the display panel DP from above the display device DD. For example, the antireflection layer RPL may include a phase retarder and/or a polarizer.

The window WIN may be disposed on the antireflection layer RPL. The window WIN may protect the display panel DP, the input detection part ISP, and the antireflection layer RPL from external scratches and impacts. The window WIN may have an optically transparent property.

The cover layer CVL may be disposed under the display panel DP. The cover layer CVL may absorb an external shock applied to a lower portion of the display device DD to protect the display panel DP. The cover layer CVL may include a foam sheet having an elastic force. An opening part OP may be defined in the cover layer CVL. The camera CAM may be disposed in the opening part OP.

The first adhesive layer AL1 may be disposed between the display panel DP and the cover layer CVL. The display panel DP and the cover layer CVL may be bonded to each other by the first adhesive layer AL1. The second adhesive layer AL2 may be disposed between the antireflection layer RPL and the input detection part ISP. The antireflection layer RPL and the input detection part ISP may be adhered (or bonded) to each other by the second adhesive layer AL2. The third adhesive layer AL3 may be disposed between the window WIN and the antireflection layer RPL. The window WIN and the antireflection layer RPL may be adhered to each other by the third adhesive layer AL3.

FIGS. 11 to 15 are schematic views illustrating the configurations of fixing parts according to various embodiments of the disclosure.

Hereinafter, the components of fixing parts FP_1, FP_2, FP_3, and FP_4 shown in FIGS. 11 to 15 will be described, focusing on a configuration different from that of the fixing part FP shown in FIG. 1. Similar to the fixing part FP shown in FIG. 1, the fixing parts FP_1, FP_2, FP_3, and FP_4 illustrated in FIGS. 11 to 15 may be disposed on the second mask MK2 along the edge of the second mask MK2.

Figure 11:
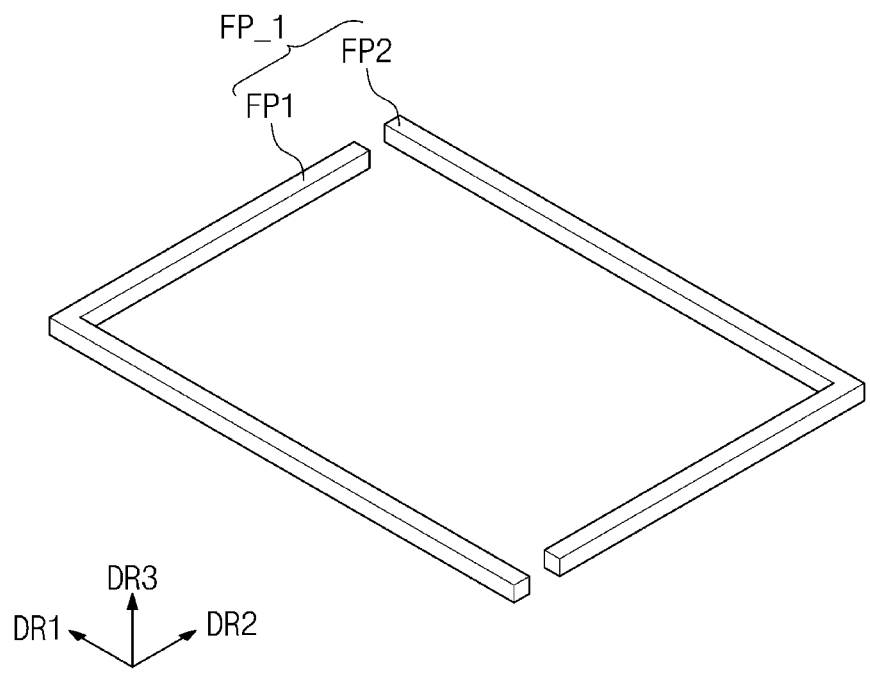
FIGS. 11 to 15 are views schematically showing the configurations of fixing parts according to various embodiments of the disclosure.

Referring to FIG. 11, the fixing part FP_1 may include a first fixing part FP1 and a second fixing part FP2 disposed adjacent to each other. The first fixing part FP1 may have an "L" shape. The second fixing part FP2 may face the first fixing part FP1 and have a shape in which the letter "L" is rotated about 180 degrees.

Figure 12:
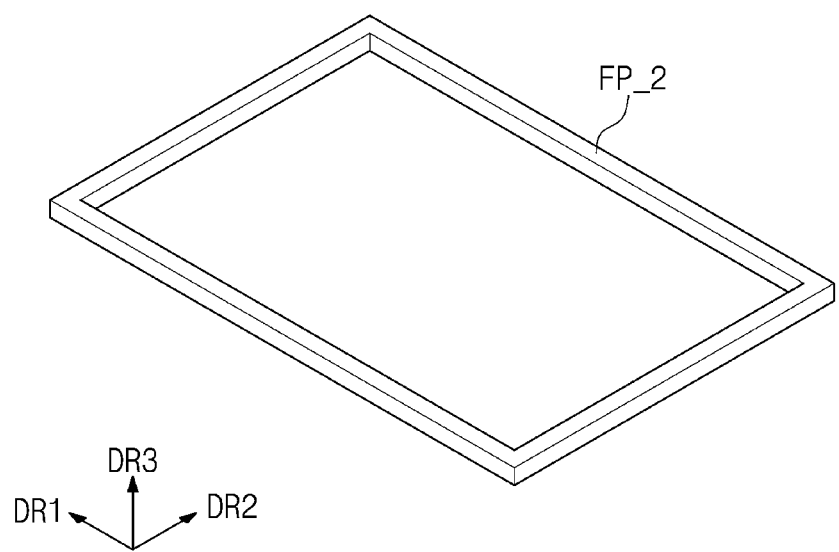

Referring to FIG. 12, the fixing part FP_2 may have a rectangular frame shape. Similar to the fixing part FP shown in FIG. 1, the fixing part FP_2 is not divided into fixing bars FB1 and FB2, and may have an integrated frame shape.

Figure 13:
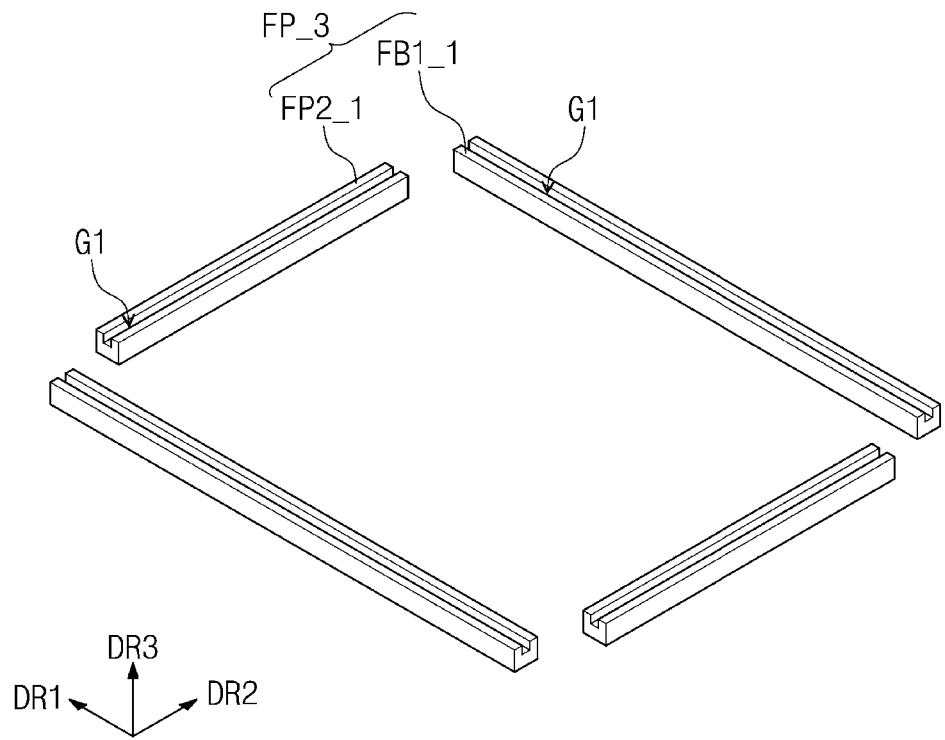

Referring to FIG. 13, a first groove G1 may be defined on an upper surface of the fixing part FP_3. The first groove G1 may be defined in a portion of the upper surface of the fixing part FP_3 and may extend in the extending direction of the fixing part FP_3.

Specifically, similar to the fixing part FP_1 shown in FIG. 1, the fixing part FP_3 may include first and second fixing bars FB1_1 and FB2_1. The first fixing bars FB1_1 may extend in the first direction DR1 and may be spaced apart from each other in the second direction DR2. The second fixing bars FB2_1 may extend in the second direction DR2 and may be spaced apart from each other in the first direction DR1.

A first groove G1 is defined in a portion of an upper surface of each of the first fixing bars FB1_1, and the first groove G1 defined in each of the first fixing bars FB1_1 may extend in the first direction DR1. The first groove G1 is defined in a portion of an upper surface of each of the second fixing bars FB2_1, and the first groove G1 defined in each of the second fixing bars FB2_1 may extend in the second direction DR2.

Figure 14:
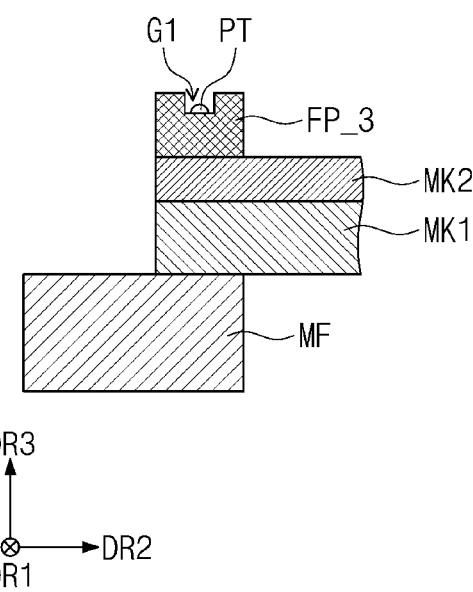

FIG. 14 is a schematic view illustrating a state in which the fixing part FP_3 shown in FIG. 13 is coupled to the second mask, the first mask, and the mask frame by welding.

By way of example, FIG. 14 illustrates a cross-section.

Referring to FIG. 14, laser welding may be performed through the first groove G1 of the fixing part FP_3. A projection PT may be formed on the fixing part FP_3 during the welding process. For example, a part of the fixing part FP_3 may be melted to form a projection PT. The projection PT may be disposed in the first groove G1.

In case that the first groove G1 is not formed in the fixing part FP_3 and the projection PT is formed on the upper surface of the fixing part FP_3 by the welding process, the mother substrate M_SUB placed on the upper surface of the fixing part FP_3 may be damaged by the projection PT. However, in the embodiment of the disclosure, since the projection PT is disposed in the first groove G1, the mother substrate M_SUB may not be damaged by the projection PT.

Figure 15:
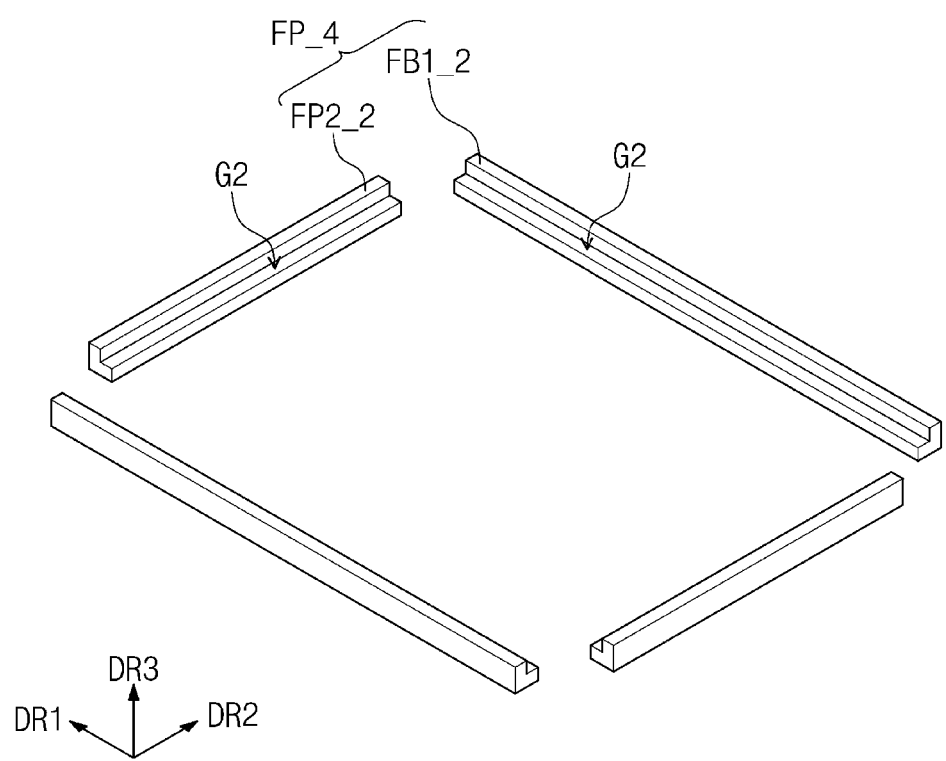

Referring to FIG. 15, a second groove G2 is defined between an upper surface of the fixing part FP_4 and a side of the fixing part FP_4, and the second groove G2 may extend in the extending direction of the fixing part FP_4. The fixing part FP_4 may include first and second fixing bars FB1_2 and FB2_2. The arrangement positions of the first and second fixing bars FB1_2 and FB2_2 may be the same as the arrangement positions of the first and second fixing bars FB1_1 and FB2_1 illustrated in FIG. 13.

A second groove G2 may be defined in the first and second fixing bars FB1_2 and FB2_2. The second groove G2 is defined between an upper surface of each of the first and second fixing bars FB1_2 and FB2_2 and a side of each of the first and second fixing bars FB1_2 and FB2_2 to extend in an extension direction of each of the first and second fixing bars FB1_2 and FB2_2.

Figure 16:
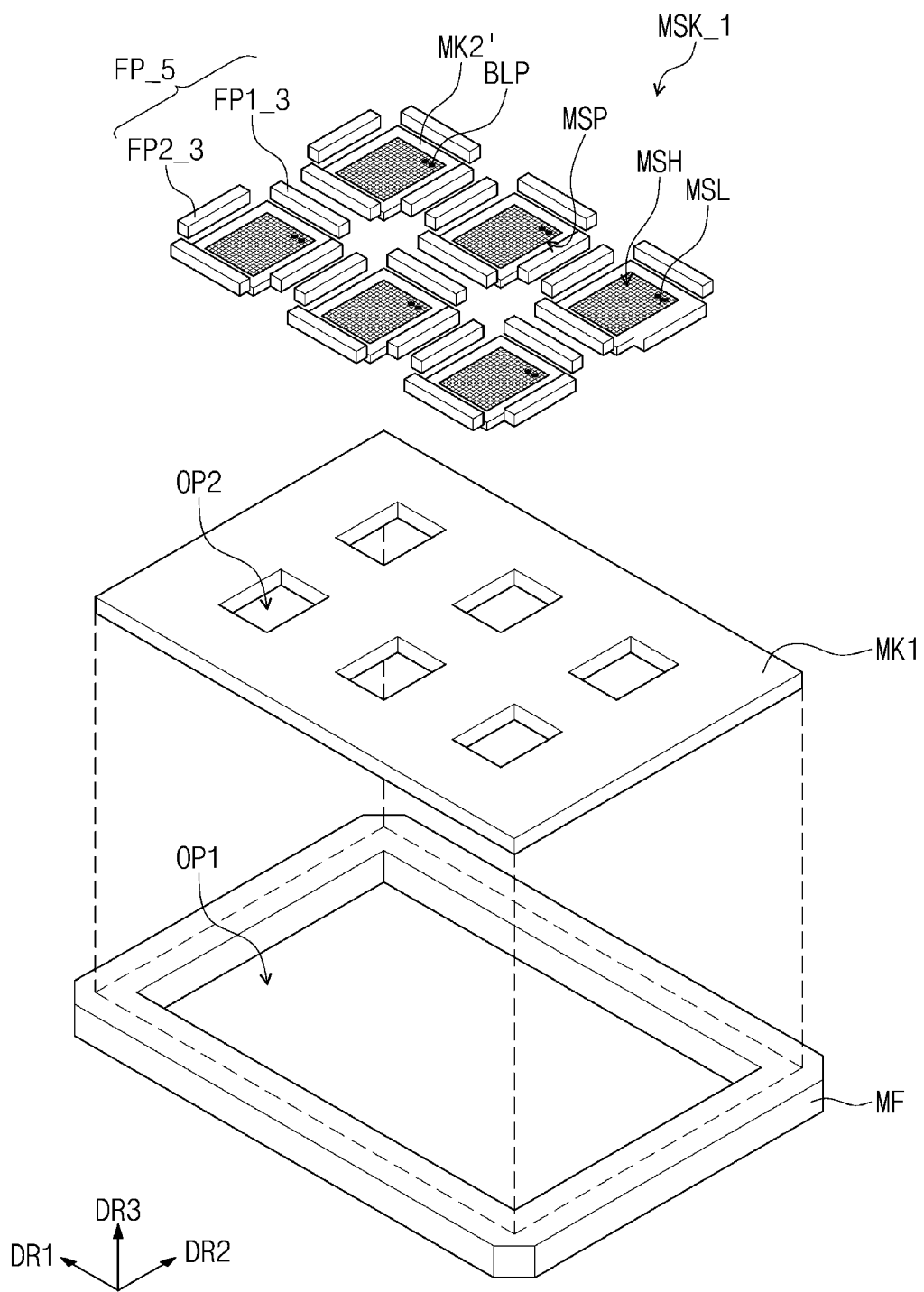
FIG. 16 is a schematic perspective view of a mask according to another embodiment of the disclosure.
Figure 17:
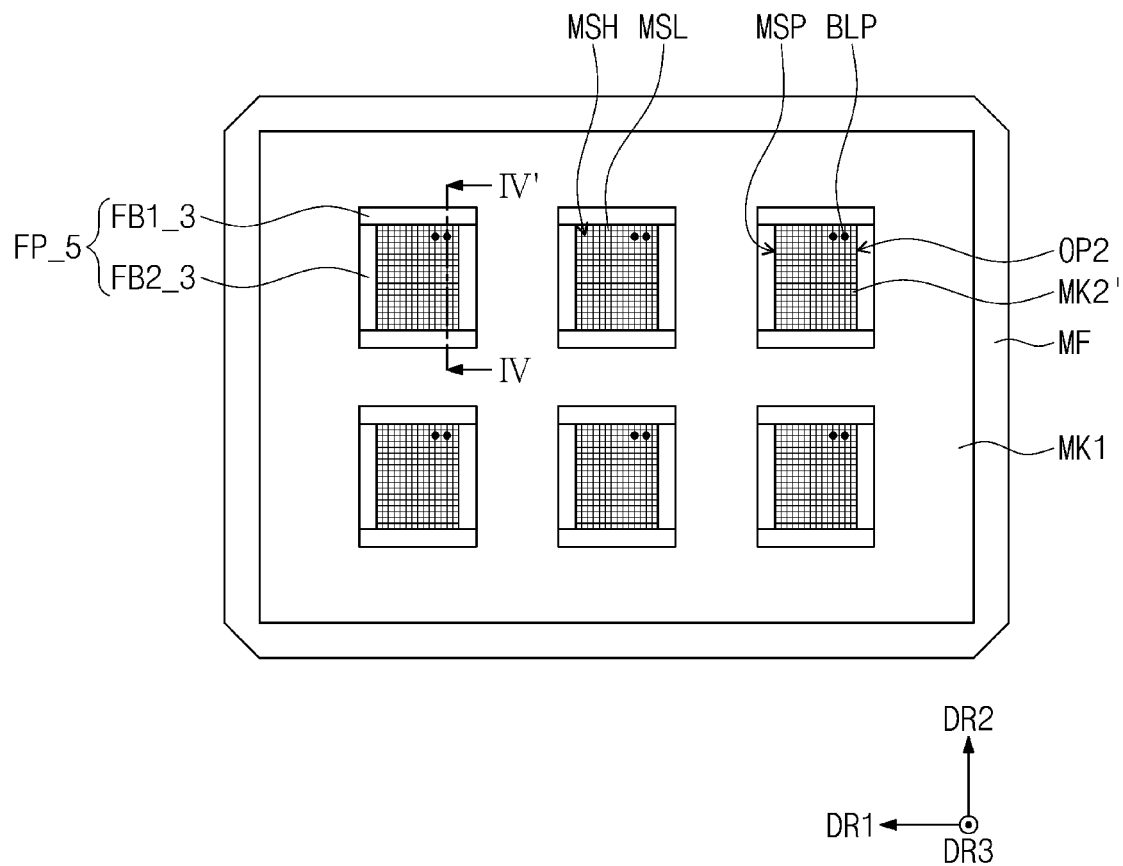
FIG. 17 is a schematic plan view of the mask shown in FIG. 16 as viewed from above.
Figure 18:
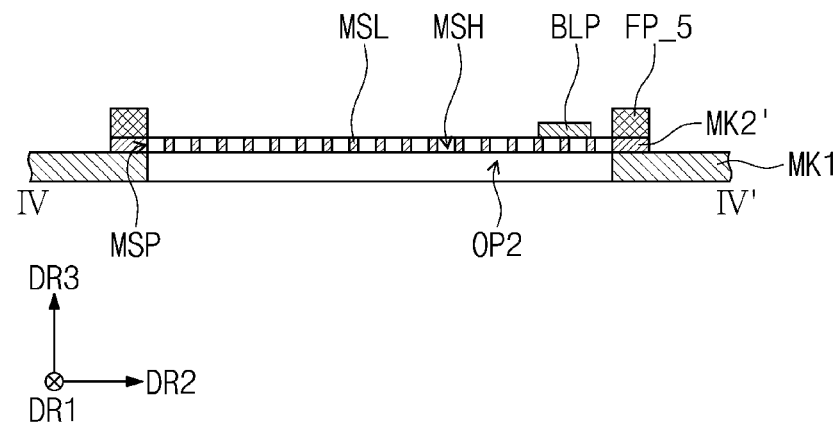
FIG. 18 is a schematic cross-sectional view taken along line IV-IV' shown in FIG. 17.

FIG. 16 is a schematic perspective view of a mask according to another embodiment of the disclosure. FIG. 17 is a schematic plan view of the mask shown in FIG. 16 as viewed from above. FIG. 18 is a schematic cross-sectional view taken along line IV-IV' shown in FIG. 17.

Except for the components of the first mask MK1 and a fixing part FP_5, the configuration of a mask MSK_1 may be the same as that of the mask MSK illustrated in FIG. 1. Accordingly, hereinafter, the configuration of the mask MSK_1 will be described mainly with a configuration different from that of the mask MSK shown in FIG. 1, and the same configuration is shown using the same reference numerals.

Referring to FIGS. 16 and 17, the mask MSK_1 may include second masks MK2' and second fixing parts FP_5 respectively disposed on the second masks MK2'. Each of the second masks MK2' may include a mesh part MSP. The mesh parts MSP of the second masks MK2' may overlap the second opening parts OP2, respectively. The blocking parts BLP may be disposed on the mesh parts MSP.

Each of the fixing parts FP_5 may include first fixing bars FB1_3 and second fixing bars FB2_3. Configurations of the first and second fixing bars FB1_3 and FB2_3 may be substantially the same as those of the first and second fixing bars FB1 and FB2 illustrated in FIG. 1, except that they differ from each other only in size.

Referring to FIGS. 17 and 18, an edge of each of the second masks MK2' may be adjacent to a corresponding second opening part OP2 among the second opening parts OP2 and be disposed outside the corresponding second opening part OP2. In a plan view, each of the fixing parts FP_5 may be disposed to surround a corresponding mesh part MSP among the mesh parts MSP and a corresponding second opening part OP2 among the second opening parts OP2. The fixing parts FP_5 may be fixed to the second masks MK2' and the first mask MK1 by laser welding.

Referring to FIG. 18, the fixing part FP_5 may be connected to a portion of the second mask MK2' adjacent to the edge of the second mask MK2'. A portion of the second mask MK2' adjacent to the edge of the second mask MK2' may be connected to a portion of the first mask MK1 adjacent to the second opening part OP2. The second mask MK2' may be more firmly fixed to the first mask MK1 by the fixing part FP_5.

Figure 19:
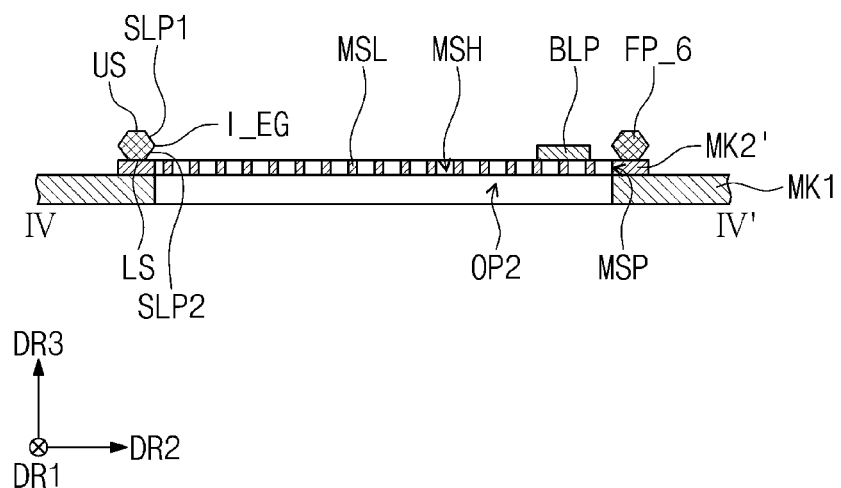
FIG. 19 is a view schematically showing the configuration of a fixing part according to another embodiment of the disclosure.

FIG. 19 is a schematic view illustrating the configuration of a fixing part according to another embodiment of the disclosure.

FIG. 19 illustrates as an example a schematic cross-section corresponding to FIG. 18. A fixing part FP_6 shown in FIG. 19 has the same configuration as the fixing part FP_5 shown in FIG. 18 except for the cross-sectional shape. Therefore, hereinafter, the cross-sectional shape of the fixing part FP_6 will be mainly described.

Referring to FIG. 19, a side of the fixing part FP_6 adjacent to the second opening part OP2 may include a first inclined surface SLP1 and a second inclined surface SLP2. Another side of the fixing part FP_6 opposite to the side of the fixing part FP_6 may have a shape symmetrical to the side of the fixing part FP_6.

The first inclined surface SLP1 may extend from an inner edge I_EG of the fixing part FP_6 adjacent to the second opening part OP2 toward an upper surface US of the fixing part FP_6 disposed higher than the inner edge I_EG. The second inclined surface SLP2 may extend from the inner edge I_EG of the fixing part FP_6 toward a lower surface LS of the fixing part FP_6 disposed lower than the inner edge I_EG. In a plan view, the inner edge I_EG of the fixing part FP_6 may be closer to the second opening part OP2 than the upper surface US of the fixing part FP_6 and the lower surface LS of the fixing part FP_6.

The first inclined surface SLP1 and the second inclined surface SLP2 may form an angle greater than about 0 degree and less than about 90 degrees with respect to the third direction DR3. The first inclined surface SLP1 and the second inclined surface SLP2 may form an angle of about 30 to about 60 degrees with respect to the third direction DR3.

Figure 20:
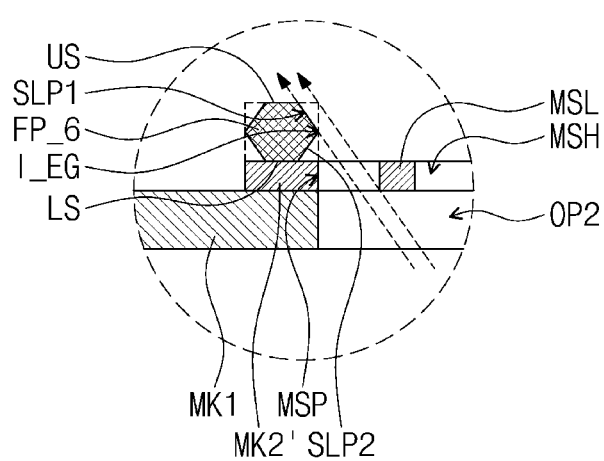
FIG. 20 is a schematically view showing a deposition material sprayed toward the fixing part shown in FIG. 19.

FIG. 20 is a schematic view illustrating a deposition material sprayed toward the fixing part shown in FIG. 19.

Referring to FIG. 20, a region in which a deposition material DPM is provided may further expand in the fixing part FP_6 having the first and second inclined surfaces SLP1 and SLP2 than in the fixing part (shown by a dotted line) having a rectangular cross section. In this case, the deposition material DPM may be provided in a wider area.

Although described with reference to embodiments, those skilled in the art will appreciate that various modifications and changes may be made to the disclosure within the scope not departing from the spirit and scope of the disclosure described in the following claims In addition, the embodiments disclosed in the disclosure are not intended to limit the technical idea of the disclosure, and all technical ideas within the scope of the following claims and equivalents should be construed as being included in the scope of the disclosure.

In case that the mask used in manufacturing the display panel is more firmly fixed, the yield of the display panel increases, and thus the disclosure has high industrial applicability.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask comprising:
   a mask frame including a first opening part;
   a first mask disposed on the mask frame and including a second opening part overlapping the first opening part in a plan view;
   a second mask including a mesh part having a mesh shape overlapping the second opening part in a plan view and disposed on the first mask; and
   a fixing part disposed on the second mask and extending along an edge of the second mask to surround the mesh part, wherein
   the fixing part comprises fixing bars each having a rod shape, the fixing bars having respective contact surfaces placed on a second surface of the second mask, the second surface of the second mask being opposite a first surface of the second mask, and the first surface of the second mask facing the first mask.

2. The mask of claim 1, wherein the fixing bars are disposed along the edge of the second mask.

3. The mask of claim 2, wherein the fixing bars comprise:
   first fixing bars extending in a first direction and spaced apart from each other in a second direction intersecting the first direction; and
   second fixing bars extending in the second direction and spaced apart from each other in the first direction.

4. The mask of claim 1, wherein
   the mesh part comprises mesh lines defining the mesh shape, and
   each of the mesh lines has a line width in a range of about 10 micrometers to about 20 micrometers.

5. The mask of claim 4, wherein a gap between two mesh lines extending parallel to each other and facing each other is in a range of about 0.5 millimeters to about 2 millimeters.

6. The mask of claim 5, further comprising:
   a blocking part disposed on a portion of the mesh part.

7. The mask of claim 6, wherein
   the blocking part has a circular shape, and
   a diameter of the blocking part is greater than the gap between the two mesh lines.

8. The mask of claim 6, wherein the blocking part is connected to the mesh lines.

9. The mask of claim 1, wherein an edge of the first mask and the edge of the second mask are adjacent to an edge of the mask frame.

10. The mask of claim 9, wherein the fixing part is connected to the second mask, the first mask, and the mask frame.

11. The mask of claim 1, wherein the fixing part comprises:
    a first fixing part having an "L" shape; and
    a second fixing part facing the first fixing part and having a shape in which the "L" shape is rotated by about 180 degrees.

12. The mask of claim 1, wherein the fixing part has a rectangular frame shape.

13. The mask of claim 1, wherein
    a groove is defined on an upper surface of the fixing part, and
    the groove extends in an extending direction of the fixing part.

14. The mask of claim 13, wherein the groove is defined in a predetermined portion of the upper surface of the fixing part.

15. The mask of claim 13, wherein the groove is defined between the upper surface of the fixing part and one side of the fixing part.

16. The mask of claim 1, wherein the edge of the second mask is adjacent to the second opening part and is disposed outside the second opening part.

17. The mask of claim 16, wherein
    the fixing part is connected to a portion of the second mask adjacent to the edge of the second mask, and
    the portion of the second mask is connected to a portion of the first mask adjacent the second opening part.

18. The mask of claim 16, wherein
    the fixing part comprises:
    an inner edge adjacent to the second opening part;
    a first inclined surface extending from the inner edge toward an upper surface of the fixing part disposed higher than the inner edge; and
    a second inclined surface extending from the inner edge toward a lower surface of the fixing part disposed lower than the inner edge, and
    the inner edge is closer to the second opening part than the upper surface of the fixing part and the lower surface of the fixing part.

19. The mask of claim 18, wherein the first inclined surface and the second inclined surface form an angle of about 30 degrees to about 60 degrees with respect to a direction perpendicular to the upper surface.

20. A mask comprising:
    a mask frame including a first opening part;
    a first mask disposed on the mask frame and including a second opening part overlapping the first opening part in a plan view;
    a second mask including a mesh part having a mesh shape overlapping the second opening part in a plan view and disposed on the first mask; and
    a fixing part disposed on the second mask and extending along an edge of the second mask to surround the mesh part, wherein the fixing part comprises fixing bars each having a rod shape, the fixing part having a thickness in a range of about 600 micrometers to about 2000 micrometers, and wherein the thickness is in a direction orthogonal to a plane coincident with a surface of the first mask that faces a surface of the second mask.

* * * * *